United States Patent [19]

Korman et al.

[11] Patent Number: 4,998,151
[45] Date of Patent: Mar. 5, 1991

[54] POWER FIELD EFFECT DEVICES HAVING SMALL CELL SIZE AND LOW CONTACT RESISTANCE

[75] Inventors: Charles S. Korman; Krishna Shenai, both of Schenectady, N.Y.; Bantval J. Baliga, Raleigh, N.C.; Patricia A. Piacente, Schenectady, N.Y.; Bernard Gorowitz, Clifton Park, N.Y.; Tat-Sing P. Chow, Schenectady, N.Y.; Manjin J. Kim, Ossining, N.Y.

[73] Assignee: General Electric Company, Schenectady, N.Y.

[21] Appl. No.: 337,684

[22] Filed: Apr. 13, 1989

[51] Int. Cl.⁵ .......................................... H01L 00/00
[52] U.S. Cl. .................................. 357/23.4; 357/86; 357/59; 357/67
[58] Field of Search .................. 357/23.4, 59 G, 59 I, 357/67 S, 86

[56] References Cited

U.S. PATENT DOCUMENTS

| | | | |
|---|---|---|---|
| 4,582,563 | 4/1986 | Hazuki et al. | 156/643 |
| 4,714,951 | 12/1987 | Baudrant et al. | 357/67 |
| 4,837,606 | 6/1989 | Goodman et al. | 357/23.4 |
| 4,890,142 | 12/1989 | Tonnel et al. | 357/23.4 |
| 4,903,189 | 2/1990 | Ngo et al. | 357/23.4 |
| 4,908,682 | 3/1990 | Takahashi | 357/23.4 |

OTHER PUBLICATIONS

Sequeda, "The Role of Thin Film Materials on the Technology of Integrated Circuit Fabrication," *Journal of Metals*, Nov. 1985, pp. 54-59.

Ho et al., "Self-Aligned Process for Forming Metal-Silicide and Polysilicon Composite Base Contact," *IBM Technical Disclosure Bulletin*, vol. 22, No. 12, May 1980, pp. 5336-5338.

*Primary Examiner*—William Mintel
*Attorney, Agent, or Firm*—Marvin Snyder; James C. Davis, Jr.

[57] ABSTRACT

A multi-cellular power field effect semiconductor device includes a high conductivity layer of metal or a metal silicide disposed in intimate contact with the source region of the device. This high conductivity layer is self-aligned with respect to the aperture in the gate electrode through which the source region is diffused. The presence of this high conductivity layer allows a substantially smaller contact window to be employed for making contact between the final metallization and the source region. As a consequence, the aperture in the gate electrode and the cell size of the device can both be substantially reduced. The device has substantially improved operating characteristics. A method of producing the device is also described.

14 Claims, 16 Drawing Sheets

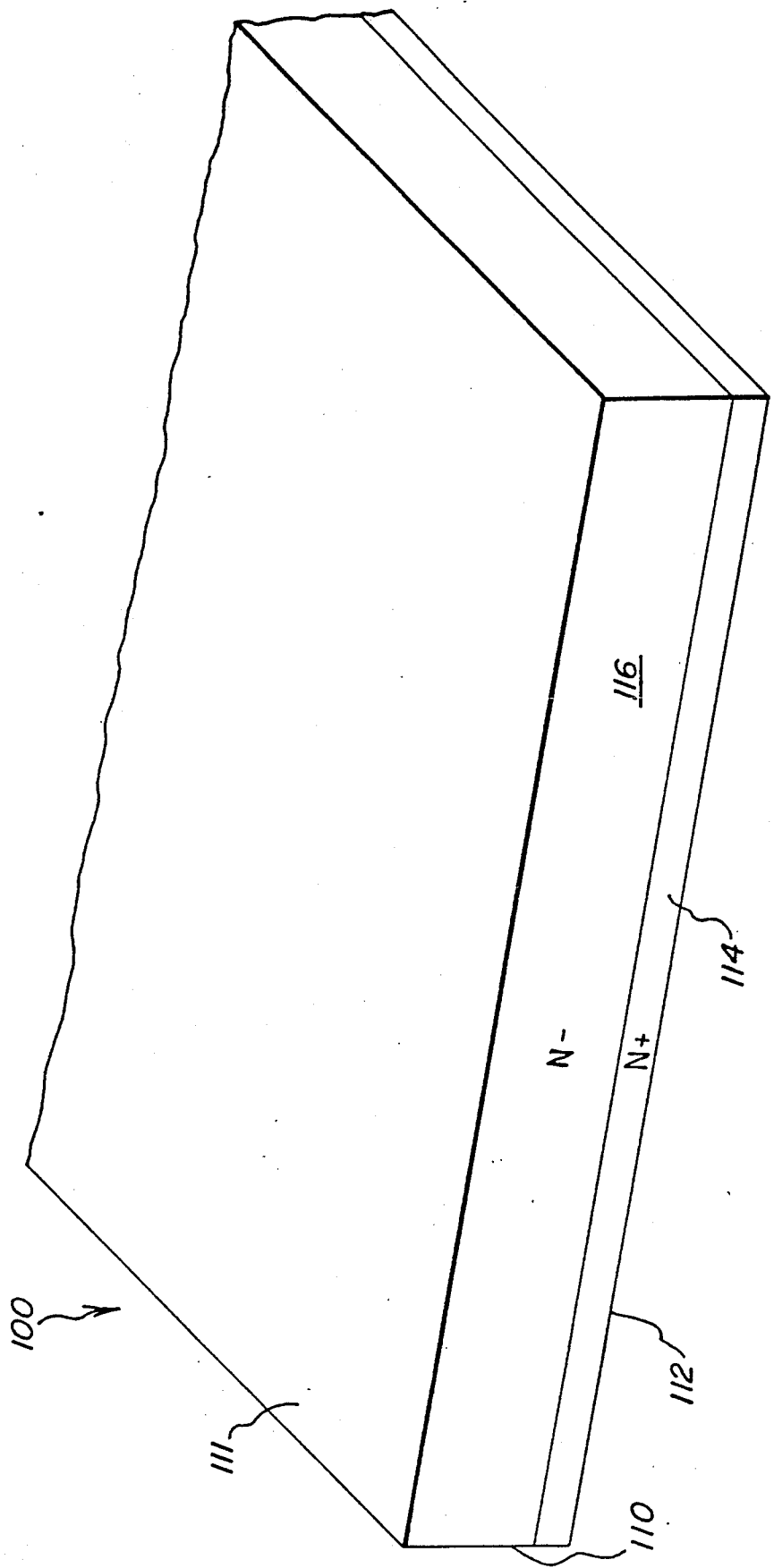

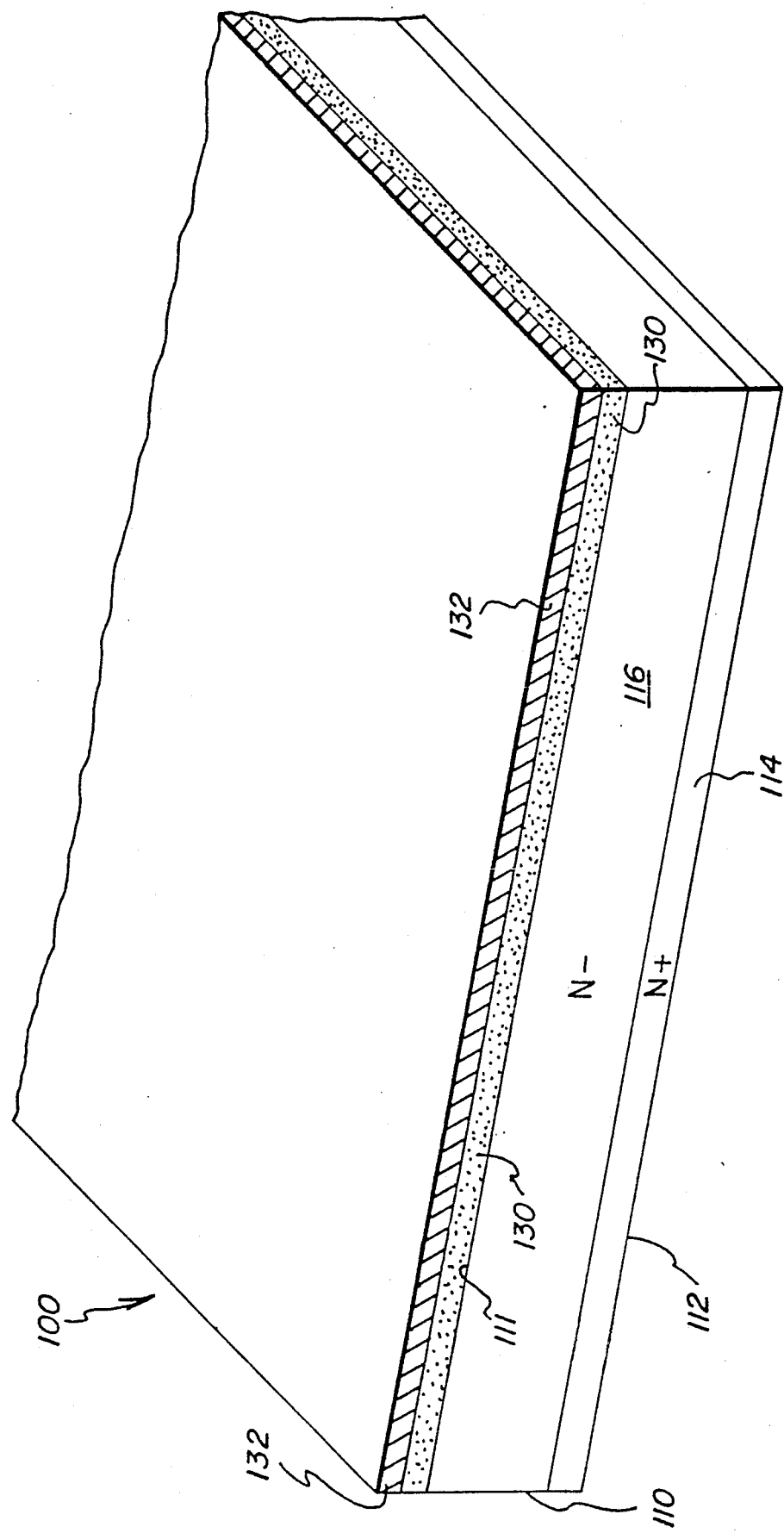

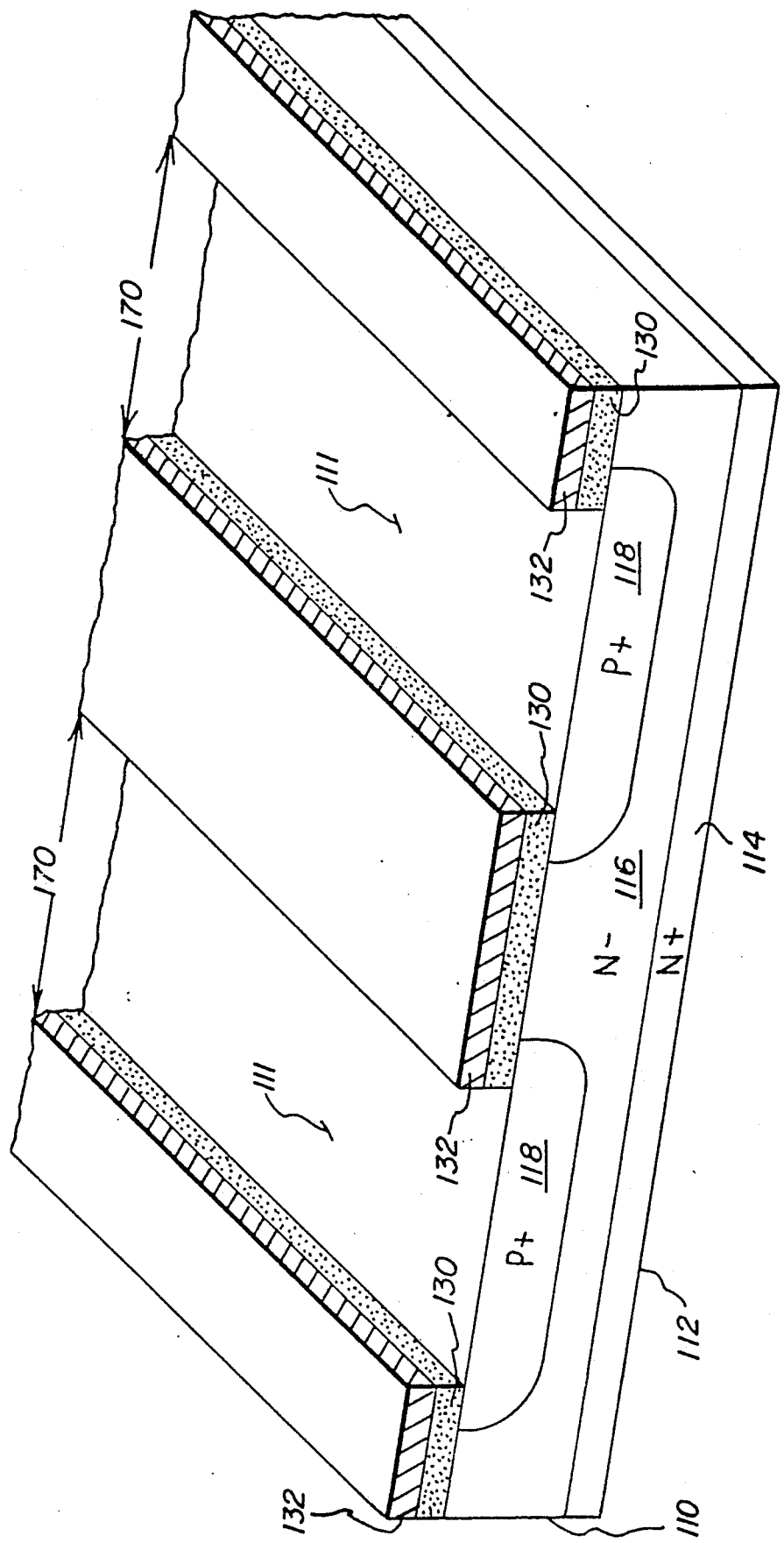

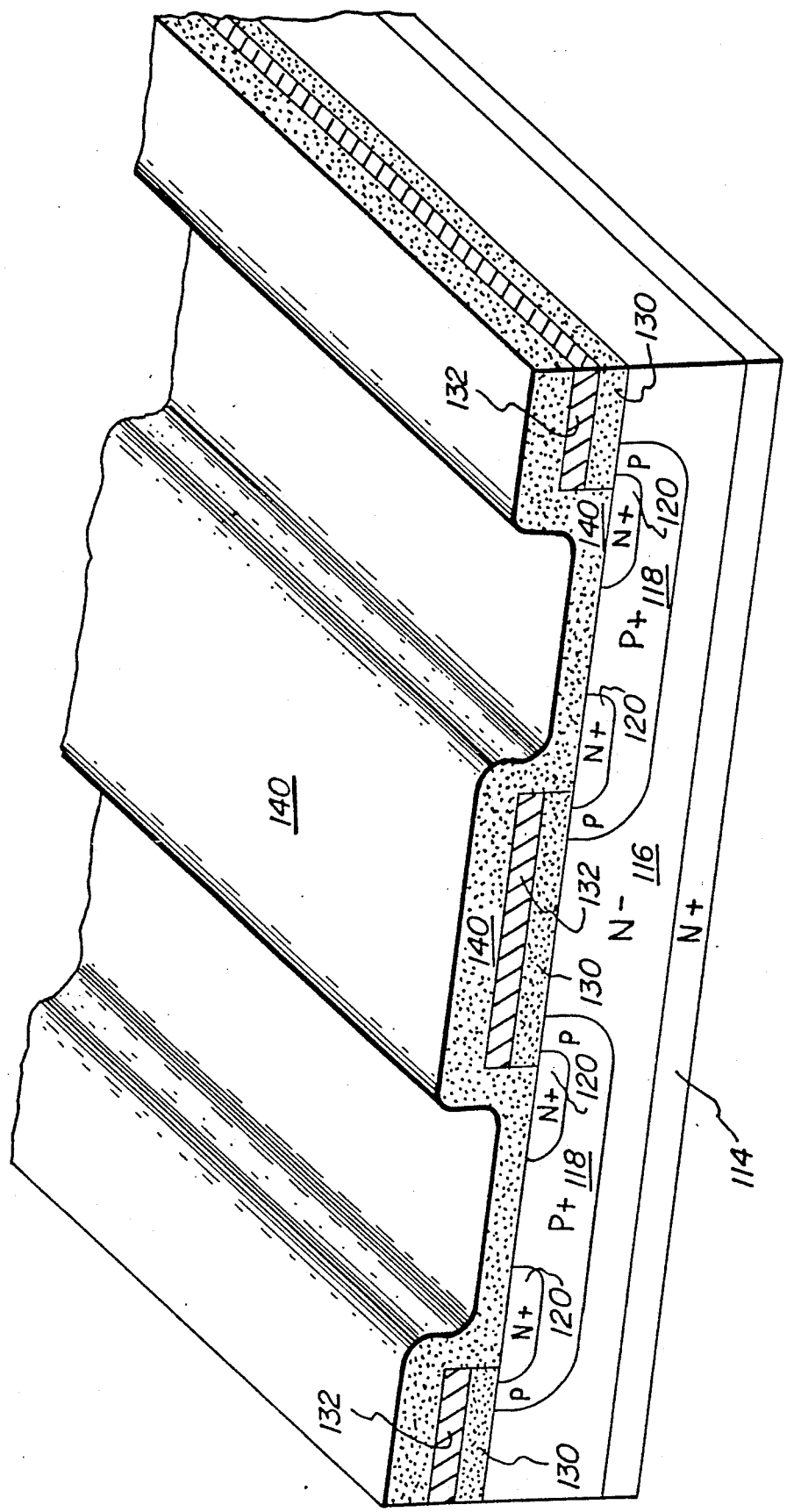

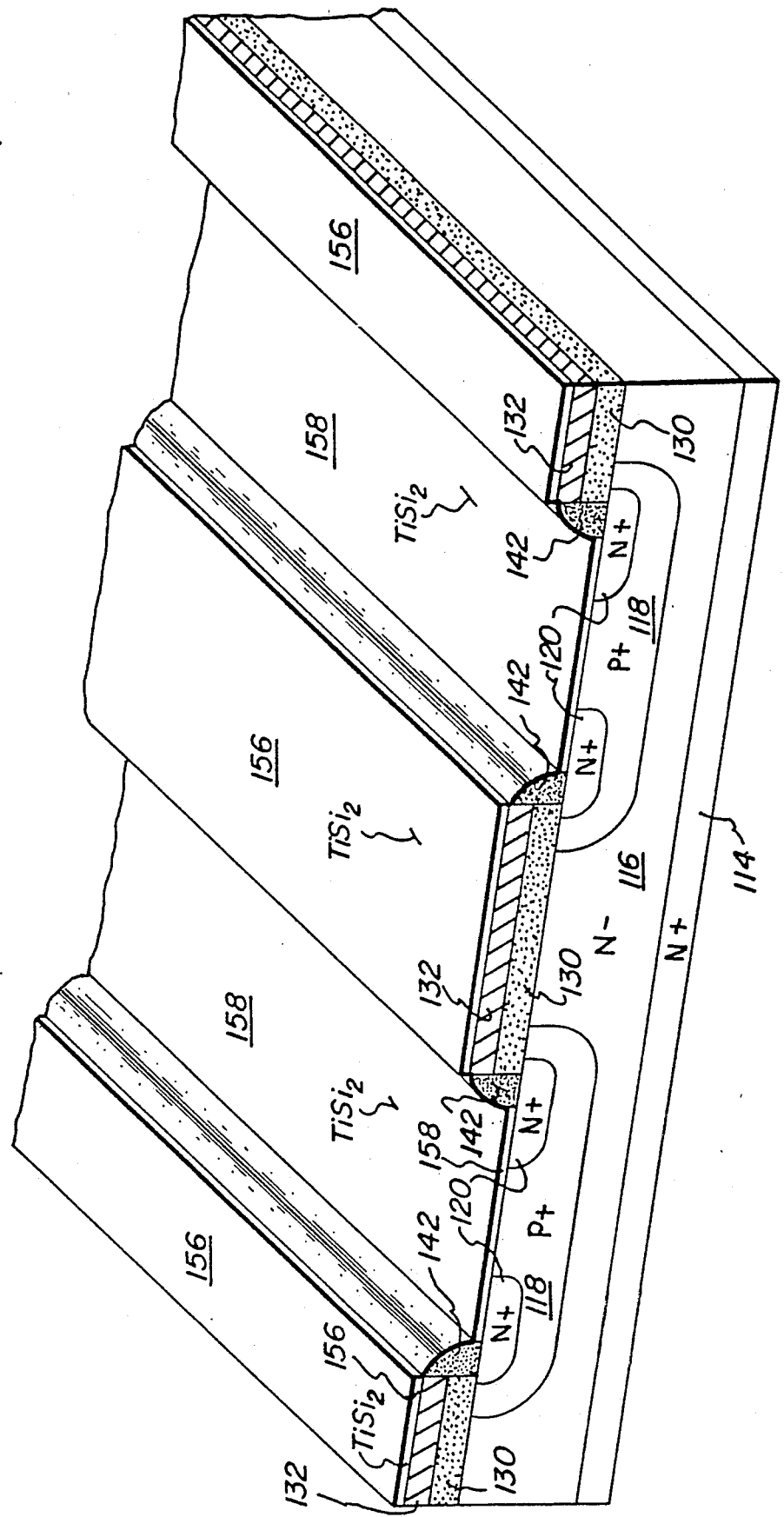

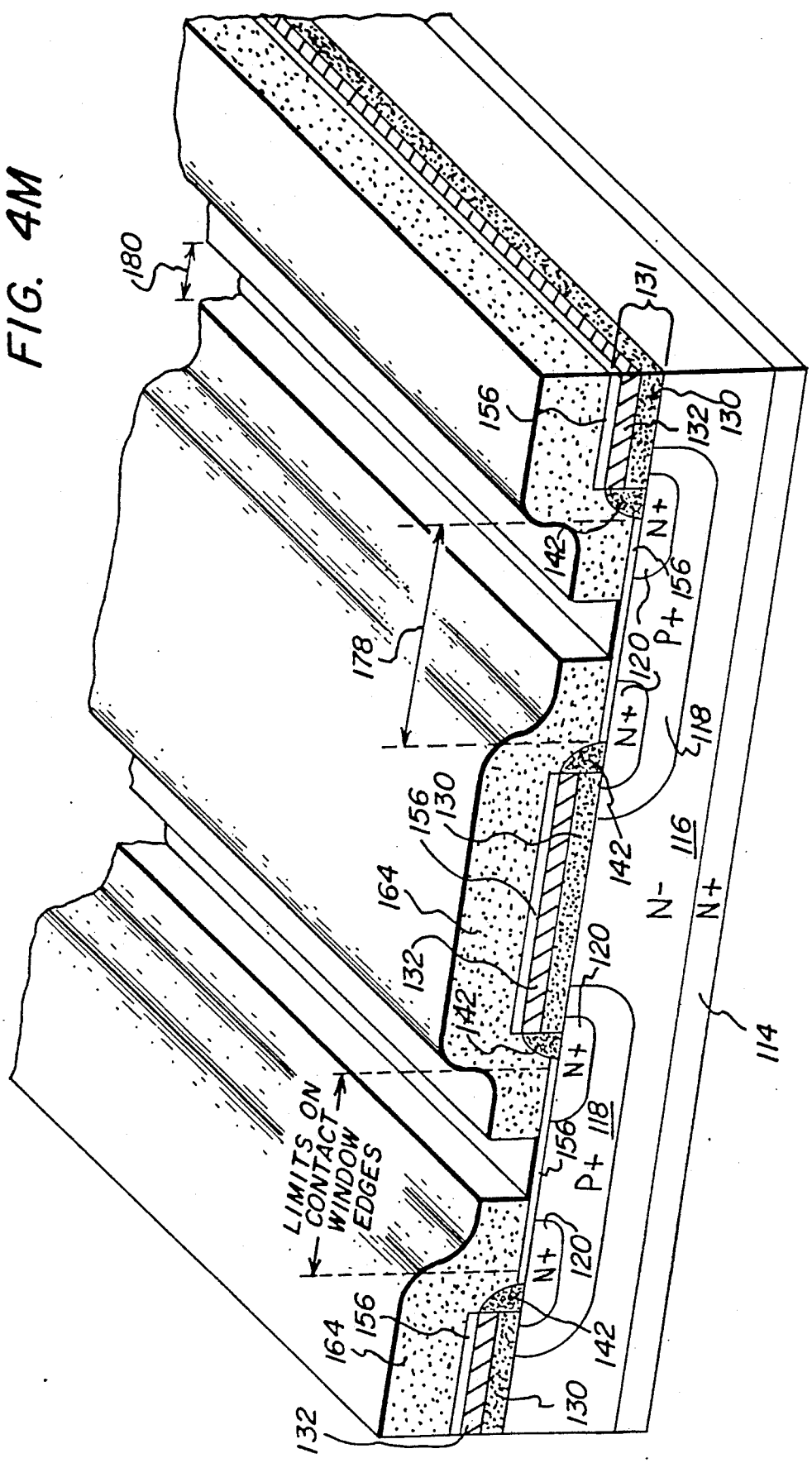

POWER FIELD EFFECT DEVICES HAVING SMALL CELL SIZE AND LOW CONTACT RESISTANCE

BACKGROUND OF THE INVENTION

The present invention relates to power semiconductor devices, and more particularly, to multi-cellular, field-effect, power semiconductor devices.

BACKGROUND OF THE INVENTION

In order to maximize the current carrying capacity of a vertical power field effect device, it is considered desirable to minimize the cell size or repeat distance (pitch) to maximize the number of cells per unit area. At the same time, it is considered necessary to minimize the contact resistance of the device metallization in order to minimize the contribution of the contact resistance to the ON-state resistance of the device and thus to its ON-state voltage. These two desires conflict with each other, especially in view of the reality that device design rules and mask alignment tolerances must be considered both in determining how small a cell size can be fabricated and in determining how small a contact area between the power electrode and each cell is acceptable from a point of view of (1) electrode contact resistance, (2) ensuring contact to the required regions of the cell and (3) ON-state voltage drop.

Reduction of contact resistance and cell size have been long term objectives in which each incremental advance improves device performance and yields a competitive edge. Consequently, as new techniques for reducing cell size or contact resistance have been developed, they have been widely adopted.

There are several deterrents to shrinking the contact area (contact window) to the source region in a vertical, multi-cellular, power field effect devices as a means of shrinking the cell size. In the cell structures commonly used for such devices, the body region of the device extends to the surface within the contact window and is contacted by the metallization along with the source region. This body region extension is normally centered within the source region. Consequently, shrinking the contact window has an amplified affect in reducing the source contact area and thus increases the current density at the contact site. Further, any such reduction in the size of the contact window substantially increases the criticality of the contact window alignment, since for good contact, the metallization must contact the source regions on all sides of the body extension and in a manner in which the current density in the contact area does not become excessive. Thus, mask fabrication and alignment tolerances limit reductions in contact window dimensions in this type of cell structure.

It is known in the semiconductor field effect transistor art to convert the surface of a gate electrode to a metal silicide in order to reduce the resistance of the gate structure to lateral current flow in order to reduce the resistance/capacitance (RC) time constant of the gate structure. It is also known in the VLSI art in which external metallization does not contact a source region along its length to silicide the surface of that source region to minimize the source region resistance to current flow along its length. Each of these uses of metal silicide is directed to the specific purpose of increasing the conductivity of a particular silicon region in order that the region itself may have a low resistance to the flow of current along the length thereof.

A structure for a vertical multi-cellular, field effect power device which enables a reduction in cell size and contact window area while maintaining a low contact resistance and ensuring metallization contact to required device regions is desirable.

OBJECTS OF THE INVENTION

A primary object of the present invention is to reduce the minimum cell size in a multi-cellular, field effect power device for a given set of design rules and mask alignment tolerances without adversely affecting the device operating characteristics.

Another object is to provide a multi-cellular field effect power device structure which enables the use of small contact windows between the metallization and the source region without adversely affecting either source contact area or contact resistance.

A further object is to increase the current carrying capacity per unit area of a multi-cellular, vertical, field effect power device as compared to prior art devices.

SUMMARY OF THE INVENTION

The foregoing and other objects are accomplished in accordance with the present invention through provision of a structure including a self-aligned high conductivity layer of metal or metal-silicide disposed in ohmic contact with the source region in combination with a contact metal-to-source contact area which is smaller in lateral dimensions than the metal or metal-silicide layer disposed on the source region. The metal or metal-silicide layer is preferably self-aligned with respect to an aperture in the gate electrode which is disposed over and preferably self-aligned with the body and source regions. This structure is preferably present in each cell of the multi-cellular device. Such devices preferably include a similar metal or metal-silicide layer disposed on the surface of the gate polysilicon. These field effect devices may be FETs, insulated gate bipolar transistors (IGBTs), MOS controlled thyristors (MCTs) or other field effect power devices.

Such a device structure may be fabricated in accordance with one embodiment of the invention by (1) oxidizing the surface of a one type conductivity semiconductor wafer to form an oxide layer, (2) depositing a polysilicon gate layer on top of the oxide layer, (3) patterning the polysilicon gate layer to provide an aperture therein which serves as a first window, (4) forming a body region of opposite type conductivity in the wafer beneath the first window and in self-alignment therewith, (5) applying a coating of photoresist to the wafer and patterning the photoresist to leave photoresist only in the vicinity of the center of the first window thereby forming a second window having smaller area at the semiconductor surface, (6) forming a source region of one type conductivity in the body region beneath the second window, (7) stripping the photoresist, (8) driving the source and body region diffusions in, (9) depositing a conformal dielectric layer over the entire upper surface of the wafer, (10) anisotropically etching the conformal dielectric layer to remove that dielectric layer everywhere except along the edges of the first window where the polysilicon gate layer stops with a sharp vertical edge (the portion of the dielectric layer which is not removed adjacent the edge of the gate window serves as a spacer which separates the wafer surface into separate third and fourth windows which are respectively coextensive with (a) the top of the polysilicon gate electrode layer and (b) the portions of body and source regions which are not covered by the spacer or the gate electrode), (11) sputtering a layer of titanium onto the upper surface of the device, (12) heating the device under conditions which cause the titanium to form a silicide with the polysilicon of the gate electrode and with the single crystalline silicon of the source and body regions while not forming a silicide with the oxide of the spacer to convert the titanium within the third and fourth windows to titanium silicide, (13) etching the device with a selective etchant to remove untreated titanium from the surface of the spacer layer, (14) further treating the titanium silicide to convert it into a more stable form, (15) depositing a layer of low temperature CVD oxide (LTO) over the semiconductor wafer and densifying it, (16) depositing a second LTO layer and densifying it, (17) coating the wafer with photoresist, (18) defining a contact hole in the photoresist, (19) etching the LTO by reactive ion etching in order to remove that oxide without removing all of the titanium silicide thereunder, (20) sputtering a layer of a barrier metal such as TiW onto the metal-silicide at the bottom of the contact hole and (21) depositing an appropriate metallization such as aluminum or an aluminum silicon alloy over the wafer.

Alternatively, where a metal layer is to be used instead of a metal silicide layer, the metal layer may be deposited using a process which deposits the metal on single crystalline and polycrystalline silicon, but not on silicon oxide. This results in fewer process steps.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 4A–4M illustrate a method in accordance with the present invention for fabricating the device of FIG. 3.

DETAILED DESCRIPTION OF THE INVENTION

Figure 1:
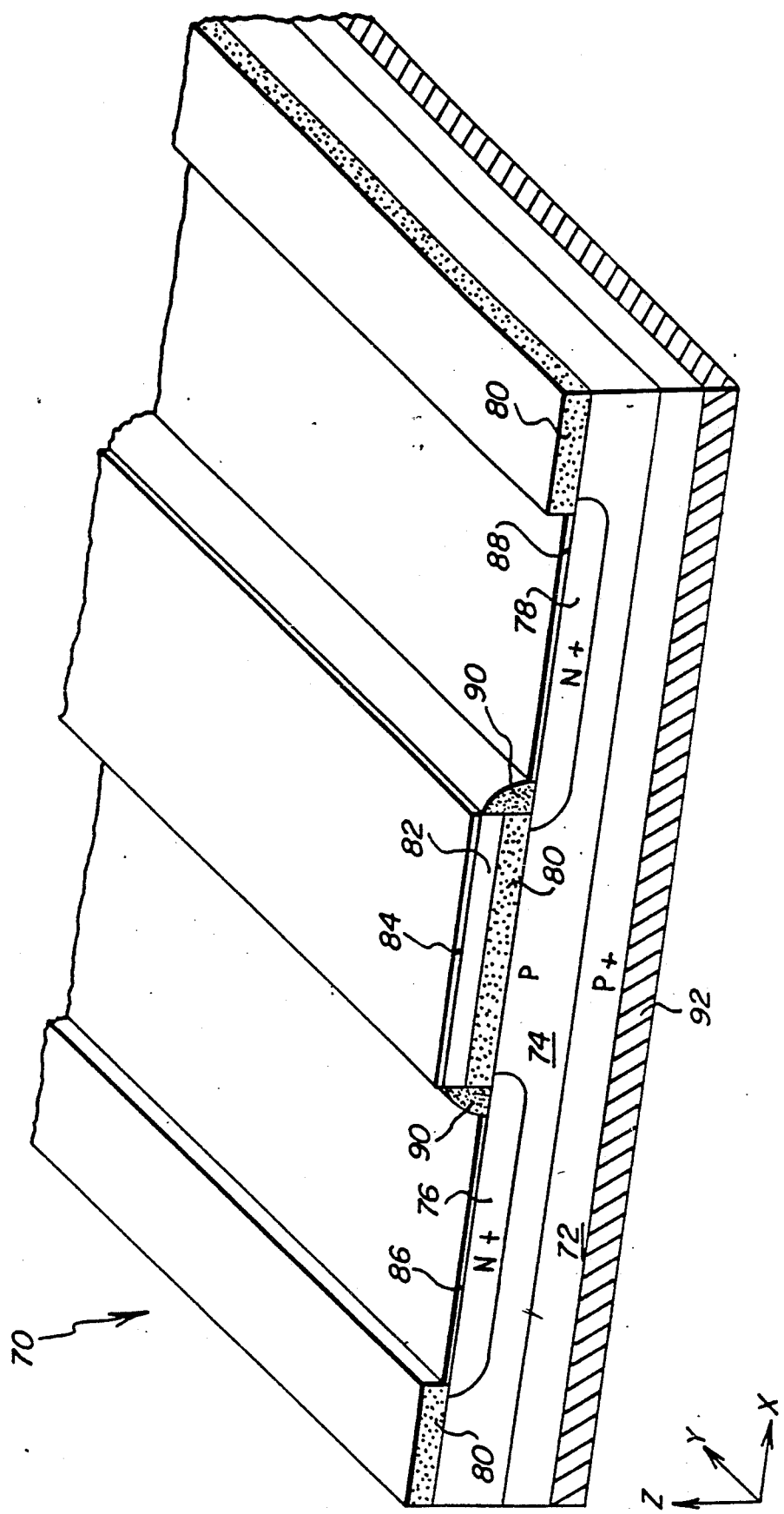
FIG. 1 illustrates a prior art VLSI structure in which a metal-silicide layer reduces the resistance of the underlying region to lengthwise flow of current.

In FIG. 1, an FET structure useful in VLSI circuitry is illustrated in a perspective, cross-section view. In this structure, an FET 70 is elongated in the Y-direction (as defined by the coordinates at the lower left of the figure) in order to increase the channel width to a desired value. The device comprises a substrate 72 of heavily doped P type (P+) material with an epitaxially grown P type layer 74 disposed thereon. An electrode 92 is disposed ohmic contact with substrate 72. N type source and drain regions 76 and 78, respectively, are diffused into the epitaxial layer 74 from the upper surface of the semiconductor body. A thermal oxide layer 80 is disposed on the upper surface of the semiconductor body and has apertures therein defining the windows through which the source and drain regions are diffused. A polysilicon gate electrode 82 is disposed on top of the oxide layer 80 between the source and drain regions. The upper surface of the gate polysilicon comprises a metal-silicide layer 84, while the exposed surface of the source and drain regions comprise metal-silicide layers 86 and 88, respectively. The metal-silicide layers 86 and 88 are spaced from the gate electrode 82 by spacers 90 which are formed by conformal deposition of an oxide layer followed by anisotropic etching of the oxide layer to remove it from the flat areas of the wafer surface while leaving a portion of it adjacent to steps in the wafer surface. In the device 70, there are no metal contacts to the gate electrode or the source and drain regions 76 and 78 which extend along their respective lengths. Metal contacts to the source and drain and gate electrodes, if any, are remote from the portion of the structure illustrated in FIG. 1. Thus, the metal-silicide layers disposed on the source, drain and gate regions are for the purpose of reducing the resistance of these regions to current flow in the Y-direction in order to improve the operating characteristics of the device.

Figure 2:
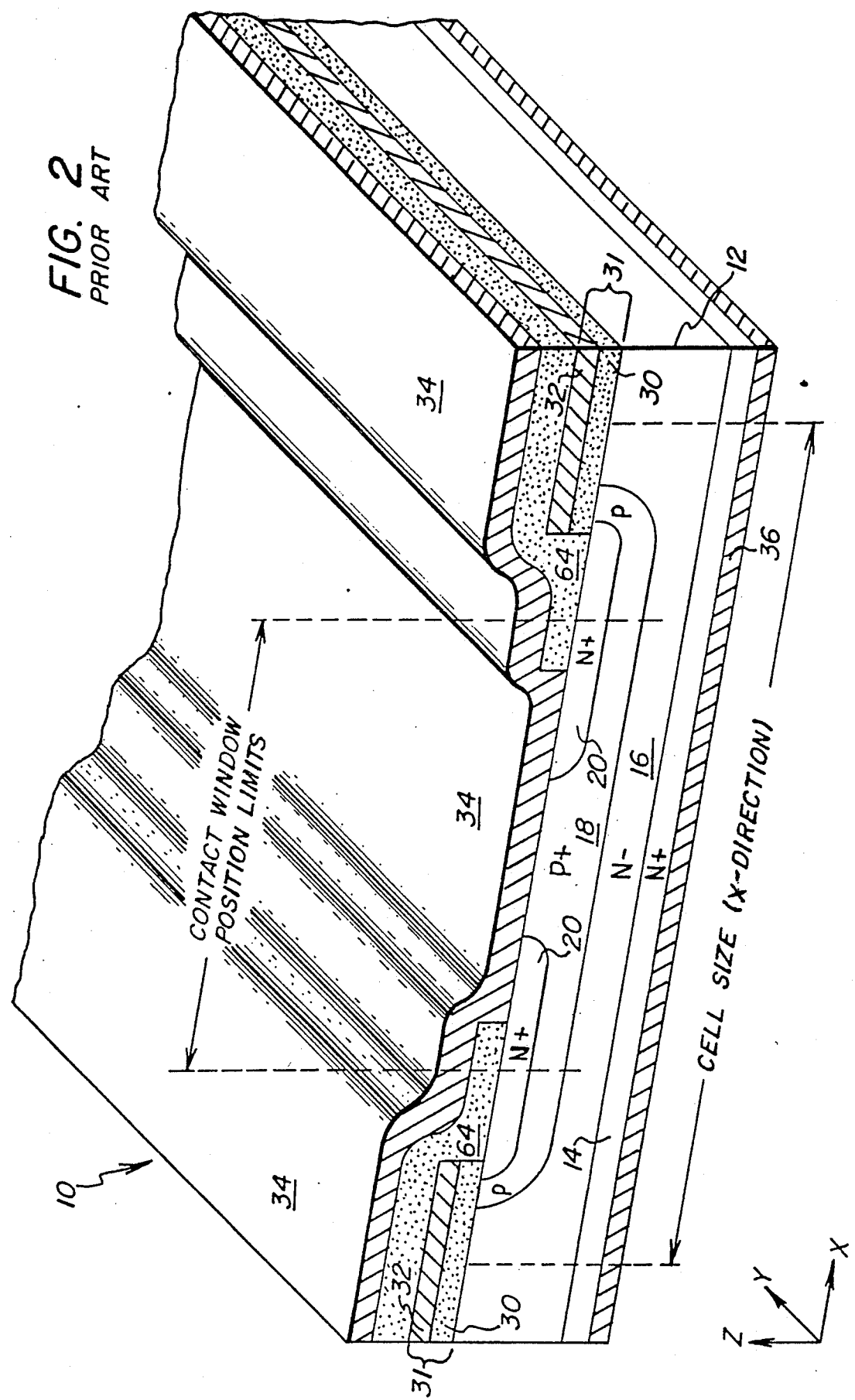
FIG. 2 is a perspective cross-section illustration of a portion of a multicellular prior art vertical power FET.

FIG. 2 illustrates in a perspective cross-section view, a portion of a prior art multi-cellular field effect power semiconductor device 10. The device 10 comprises a body 12 of semiconductor material having upper and lower major surfaces and including an N+ drain layer 14 adjacent its lower surface, an N− drift region 16 extending from adjacent the drain region 14 to the upper surface of the semiconductor body. A body region 18 of P+ material extends into the drift region from the upper surface of the semiconductor body. A heavily doped N+ source region 20 extends into the body region 18 from the upper surface of the semiconductor material. The source region 20 in the plane of the cut in the figure consists of two separate portions which are locally spaced apart by a portion of the body region 18 which extends to the upper surface of the semiconductor body between the two portions of the source region. These two portions of the source region are normally connected together in a portion of the structure which is not shown in FIG. 2. An insulated gate electrode 31 is disposed on the upper surface of the semiconductor body and comprises a thermal oxide layer 30 and a polysilicon layer 32. The body region 18 and the source region 20 are self-aligned with respect to an aperture in this gate electrode. A dielectric layer 64 is disposed over the upper surface of the wafer except in a contact opening in which an upper metallization layer 34 extends through the aperture in the dielectric layer 64 into ohmic contact with the body region 18 and the source region 20. A drain electrode 36 is disposed in ohmic contact with the drain region 14 on the lower surface of the device. The gate electrode 31 has contact metallization disposed thereon near the periphery of the device as is common in the art. The contact window through which the metallization 34 contacts body region 18 and source region 20 is made relatively wide to ensure that even at maximum mask misalignment, there is adequate contact between the metallization 34 and whichever portion of the source region the window is displaced away from. The aperture in the gate electrode must be made wide enough to ensure that at maximum mask misalignment, the contact metallization will not short to the gate electrode or produce a thin, low breakdown voltage dielectric region therebetween. Thus, the contact window edges must be positioned between the contact window position limits illustrated in FIG. 4.

Figure 3:
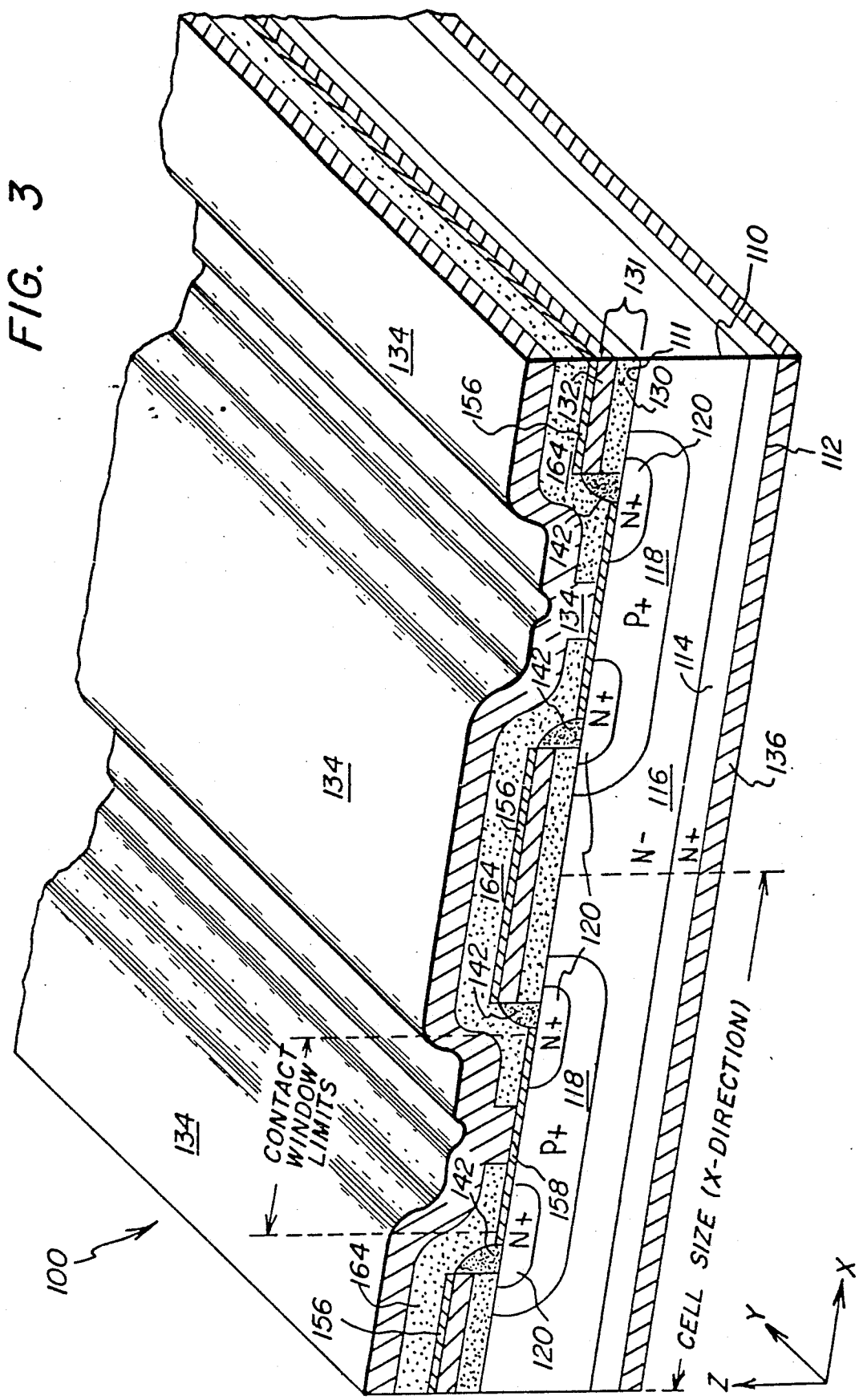
FIG. 3 is a perspective cross-section illustration of a portion of a multicellular device structure in accordance with the present invention.

A device 100 in accordance with the present invention is illustrated in perspective, cross-section view in FIG. 3. The device 100 comprises a body 110 of silicon semiconductor material having an upper surface 111 and a lower surface 112. The surfaces 111 and 112 are opposed major surfaces of a wafer and are normally substantially parallel to each other. The body 110 comprises an N+ drain region 114 which is disposed adjacent the lower surface 112 of the semiconductor body, an N− drift region 116 disposed contiguous to and above the drain region 114. A body region 118 of P type material extends into the drift region from the upper surface 111 of the semiconductor body. An N+ source region 120 extends into the body region 118 from the upper surface 111 of the semiconductor body. An insulated gate electrode 131 is disposed on the upper surface 111 of the semiconductor body. The gate electrode is comprised of an insulating layer 130 (preferably thermal oxide) disposed directly on the upper surface 111 of the semiconductor body and a conductive polycrystalline silicon layer 132 disposed on that gate oxide. The upper surface of the polycrystalline silicon 132 comprises a titanium-silicide layer 156 which serves to provide the gate electrode with high lateral conductivity. In fact, the lateral conductivity of the titanium silicide layer is easily made high enough that the polycrystalline silicon 132 itself does not need to be highly conductive. This provides the advantage of minimizing the tendency of a dopant (which would otherwise be used to raise the conductivity of the polycrystalline silicon) to diffuse into or through the oxide layer 130. A second titanium-silicide layer 158 is disposed in contact with the source region 120 and the body region 118 where they extend to the surface within the aperture in the gate electrode. The metal-silicide layer 158 is spaced from the gate oxide 130 and the gate polycrystalline silicon 132 by a spacer 142 of oxide. The metal silicide layer 158 is self-aligned with respect to the aperture in the polycrystalline silicon insulated gate electrode 131. A dielectric layer 164 is disposed over the upper surface of the wafer except in contact openings in which the upper metallization layer 134 extends through an aperture in the dielectric layer 164 into ohmic contact with the body region 118 and the source region 120. A drain electrode 136 is disposed in ohmic contact with the drain region 114 on the lower surface of the device. An overlying source metallization layer 134 makes ohmic contact to the metal-silicide layer 158 near the X-direction center of that metal-silicide layer. As illustrated in FIG. 3, it is not necessary that the contact between the metallization 134 and the metal-silicide layer 158 be disposed over the source region or extend across the entire surface intercept of the body region 118 within the aperture in the source region 120. The extension of the body region 118 to the surface 111 locally spaces the lefthand portion of the source region 120 from the righthand portion of the source region 120 which is within that cell. We say locally spaces because the lefthand and righthand portions of the source region of a single cell are normally connected together in the portion of the structure which is not visible in the figures. In the absence of the metal-silicide layer 158, displacement of the contact window from either the lefthand or righthand portion of the source region would adversely affect device performance since the non-contacted portion of the source region would only be connected to the metallization through a relatively long current path within the source region itself.

This device structure provides a substantial advantage over the prior art power field effect device illustrated in FIG. 2. FIGS. 2 and 3 are drawn to the same X-direction scale to illustrate the manner in which a device in accordance with the present invention may employ a substantially smaller cell size than can a device using the same design rules which is fabricated in accordance with the prior art process and device structure. There are several reasons for this difference. First, since the metal-silicide layer 158 is self-aligned with respect to the aperture in the polycrystalline silicon gate, the structure itself ensures that the metal-silicide layer makes wide contact to both of the portions of the source region 120 which are shown in FIG. 3 and to the body region 118. Second, the metal-silicide layer 158 is of substantially higher conductivity than either the source or body regions. Consequently, whereas in the prior art structure it was essential for the metallization layer to contact both sections of the source region in order to ensure good ohmic contact to both sections of the source region, this is unnecessary in accordance with the inventive structure.

Further, any displacement of the contact between the metallization 134 and the metal silicide layer 158 from the center of the aperture in the gate electrode has, at most, an insignificant effect on the conductivity of the contact between the metallization and each of the source region segments, so long as the edge of the contact is within the contact limits shown in FIG. 3.

A further benefit of this structure is that it renders the device operating characteristics relatively insensitive to the displacement of the aperture in the source region (where the body region extends to the surface) with respect to the center of the aperture in the gate electrode, so long as a major displacement is not present. This enables a non-self-aligned process to be used to locate the aperture in the source region. If tighter tolerances are desired, the self-aligned process taught in U.S. patent application Ser. No. 220,353, filed July 14, 1988, as a continuation of application Ser. No. 938,693, filed Dec. 5, 1986, by P. V. Gray et al. and entitled "Method of Fabricating Self-Aligned Semiconductor Devices" may be used. That patent application is incorporated herein by reference.

Thus, each of the effects of the presence of the metal-silicide layer 158 enables the production of a device having superior operating characteristics with a substantially smaller cell size.

It will be noted, that the width of the cell illustrated in FIG. 3 is smaller than that in the prior art process by about 40% of the difference in the width of the contact area because the process of producing a device in accordance with the present invention has no critical mask alignment steps which would result in inoperative or poorly operative devices.

While the structure illustrated in the figures is a vertical FET, this invention is applicable to any device having a similar structure, and in particular, is applicable to insulated gate bipolar transistors (IGBTs), to MOS controlled thyristors (MCTs) and so forth. These other device types will include additional layers in a manner well known in the art. For example, an IGBT will include an additional layer of P type material between the electrode 136 and the drift region 116.

The cells of the device 100 are shown and have been described as being parallel, elongated (straight stripe)

cells which extend in the Y-direction. However, this invention is also applicable to cells of other shapes or configurations, including but not limited to rectangular, including square; hexagonal; round or elliptical, including circular; and so forth.

In a multi-cellular device, such cells may all be of substantially uniform size and packed along the wafer surface in an array pattern or may be arranged in a concentric configuration as may be desired. This invention can have a greater impact on cell packing density with square, hexagonal and circular cells than with parallel, straightstripe Y-direction elongated cells because in the former case, packing density is increased in both the X and Y-directions which multiplies the effect, whereas in the latter case, the cell packing density is increased only in the X-direction.

The device of FIG. 3 may be fabricated in accordance with a process whose steps are illustrated in FIGS. 4A-4M.

Referring now to FIG. 4A, the beginning of a process for producing the device 100 is shown. In FIG. 4A, a semiconductor wafer 110 has an upper surface 111 and a lower surface 112. The surfaces 111 and 112 are opposed major surfaces of the wafer 110. Adjacent the lower surface 112 is an N+ layer 114 which forms the drain region of the final device. The remainder of the wafer in FIG. 4A is a lightly doped N type (N−) layer 116 which, in the final device, comprises the drift region of the device.

Figure 4B:
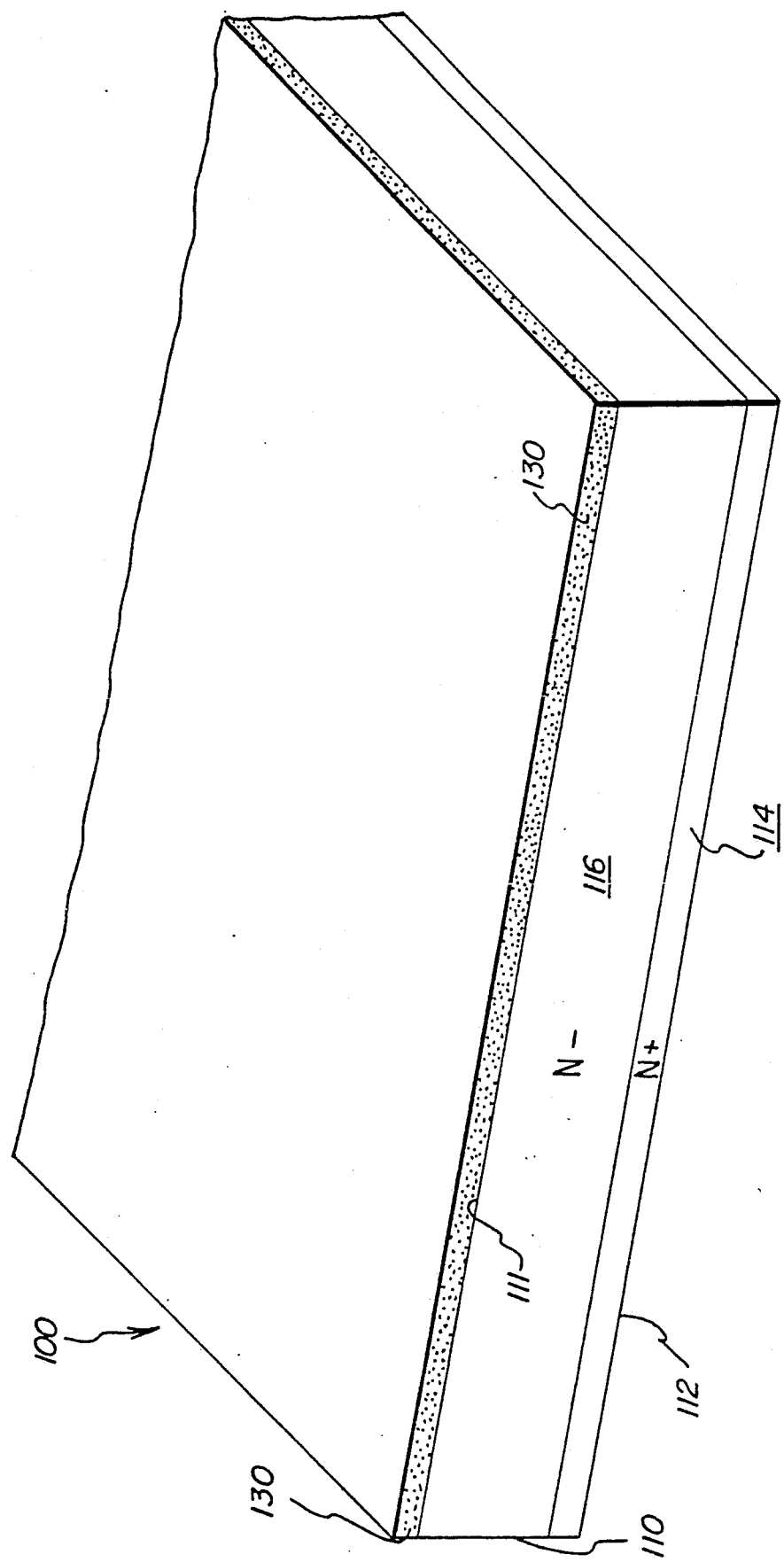

In FIG. 4B, the upper surface of the wafer has been thermally oxidized in a manner well known in the art to form a 500-1000 angstrom thick thermal oxide layer 130 across the entire upper surface of the wafer 110. Thereafter, in FIG. 4C, a substantially uniform layer 132 of polycrystalline silicon has been deposited on top of the oxide layer. The polycrystalline silicon may preferably have a thickness of 4000 to 8000 angstroms and may be deposited in any well known manner such as by pyrolytic decomposition of silane ($SiH_4$).

Figure 4D:
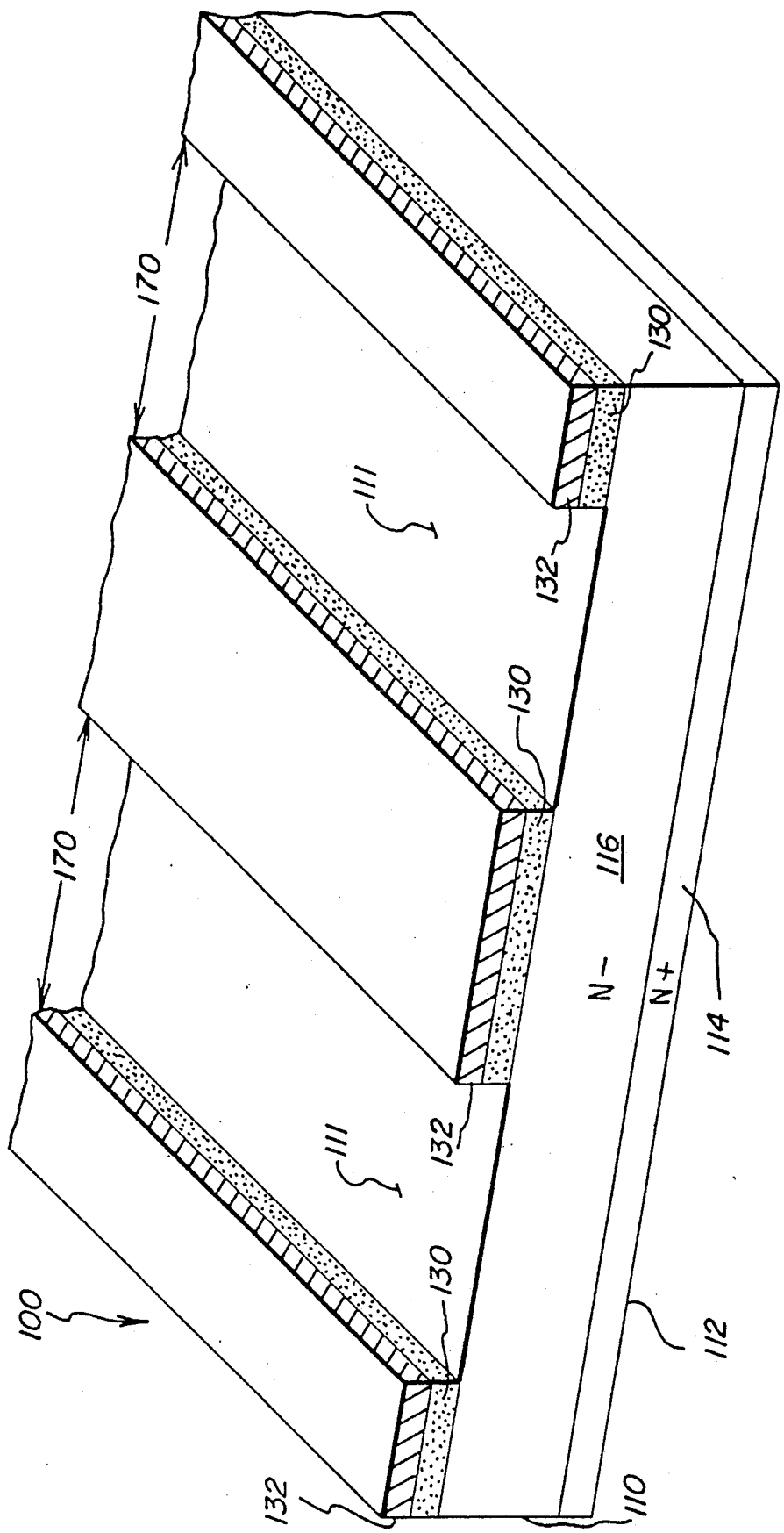

In FIG. 4D, the polycrystalline silicon layer 132 and the oxide layer 130 have been patterned and etched away to form a window 170 at the bottom of which the upper surface 111 of wafer 110 is exposed. It is important to the proper operation of the process that the edges of the polycrystalline silicon and oxide at the edge of the window have essentially vertical surfaces. One method of providing such vertical walls is to etch the window 170 by reactive ion etching (RIE).

In FIG. 4E, the structure is shown after the diffusion of a P+ body region 118 through the window 170.

Figure 4F:
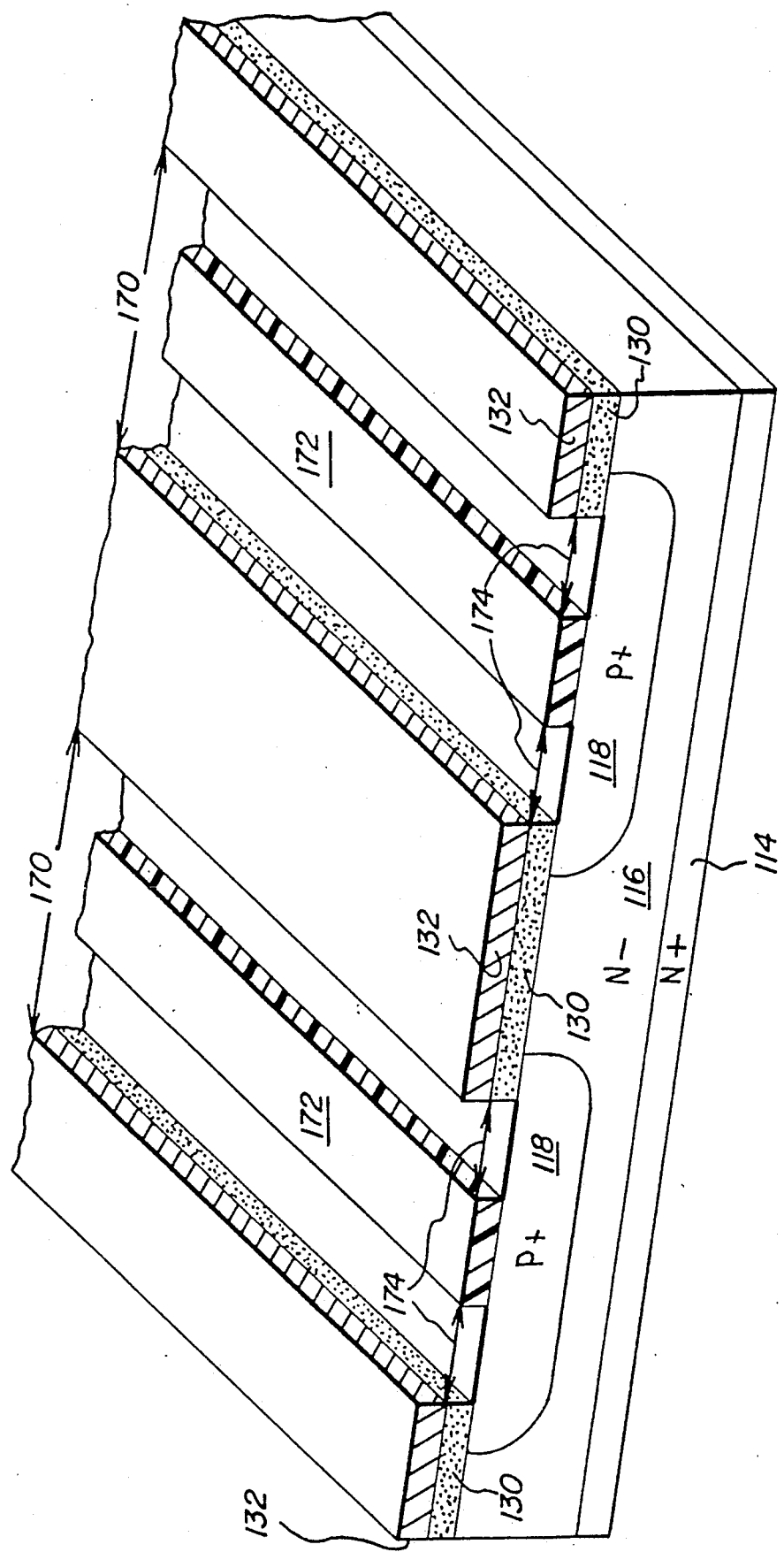

Next, the wafer is coated with a layer of photo-resist which is patterned to leave a central segment 172 of the photoresist centered in the window 170 as shown in FIG. 4F. Because this photoresist pattern is controlled by a mask, the segment 172 may in fact be displaced somewhat from the center of the window. For reasons discussed herein, minor displacements of the photoresist segment 172 from the center of the window 170 do not have a significant effect on device operation. The presence of a photoresist 172 converts the window 170 into a smaller apertured window 174. While the portion of the window 174 on opposite sides of the photoresist segment 172 are not connected in the segment of the structure shown in FIG. 4F, these are preferably connected at the ends of the window 170 and may also be connected at other points within the window 170 as may be considered desirable.

Figure 4G:
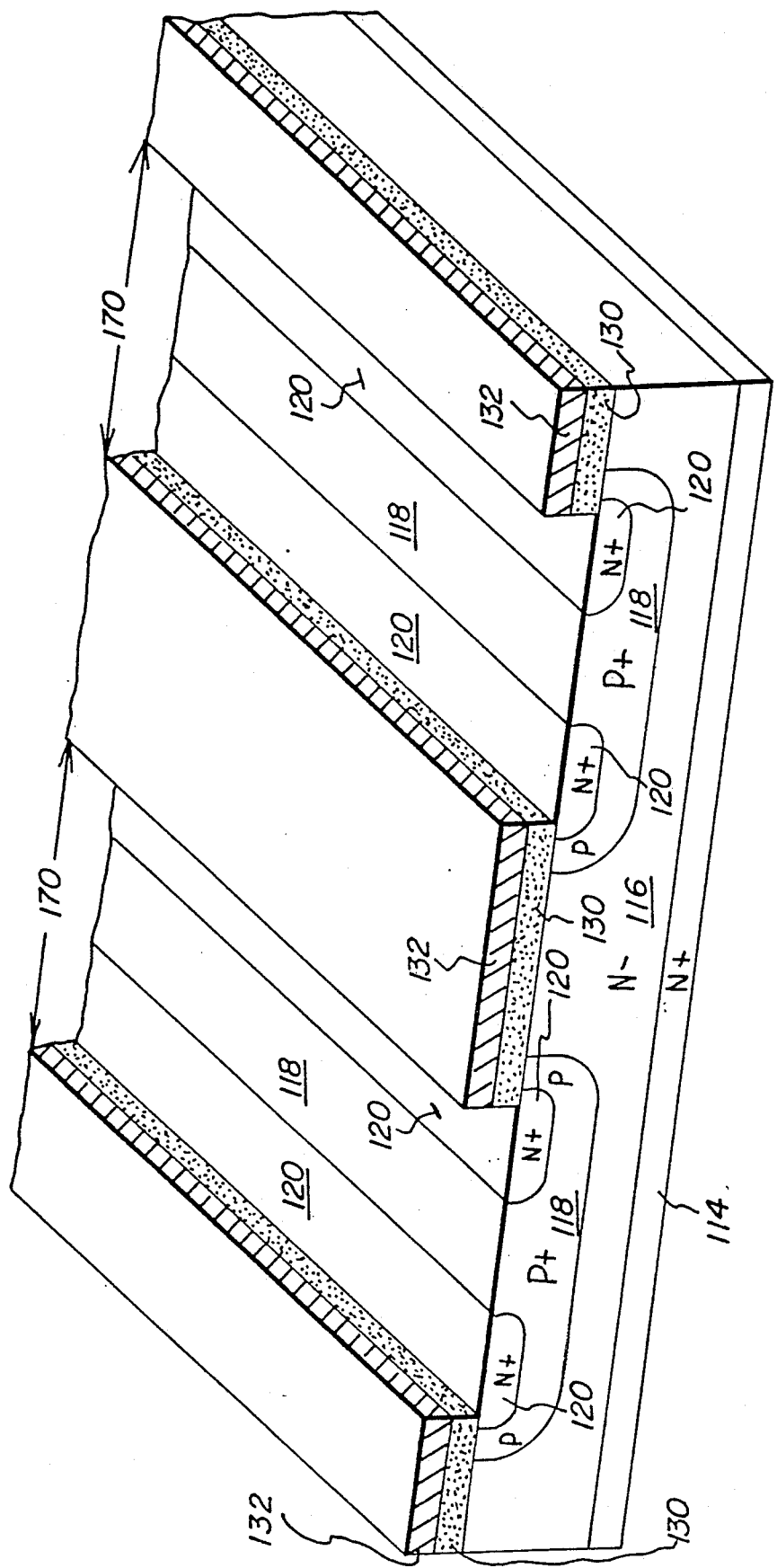

Next, a heavy concentration of an N type dopant is implanted through the window 174 into the surface of the semiconductor body 110 and into the polycrystalline silicon 132. Thereafter, the photoresist is stripped from the wafer and the wafer heated to drive the diffusions of the body region 118 and the source regions 120 into the semiconductor body 110. The device at the end of this step is shown in FIG. 4G.

In FIG. 4H, a 4000-8000 angstrom thick layer of high temperature oxide (HTO) has been deposited on the wafer. This is preferably done at a temperature in the vicinity of 900° C. by the decomposition of dichlorosilane by nitrous oxide. The result is a conformal layer of oxide. Other dielectrics may be used as is appropriate. What is meant by a "conformal layer" of a dielectric or other material in this patent is a layer which deposits to a uniform depth over both horizontal and vertical portions of the upper surface of the semiconductor wafer. Thus, the thickness of the oxide 140 is substantially the same when measured vertically from horizontal portions of the upper surface of the polycrystalline silicon 132 and when measured horizontally from vertical portions of the surface of the polycrystalline silicon 132 at the edges of the window 170.

Figure 4I:
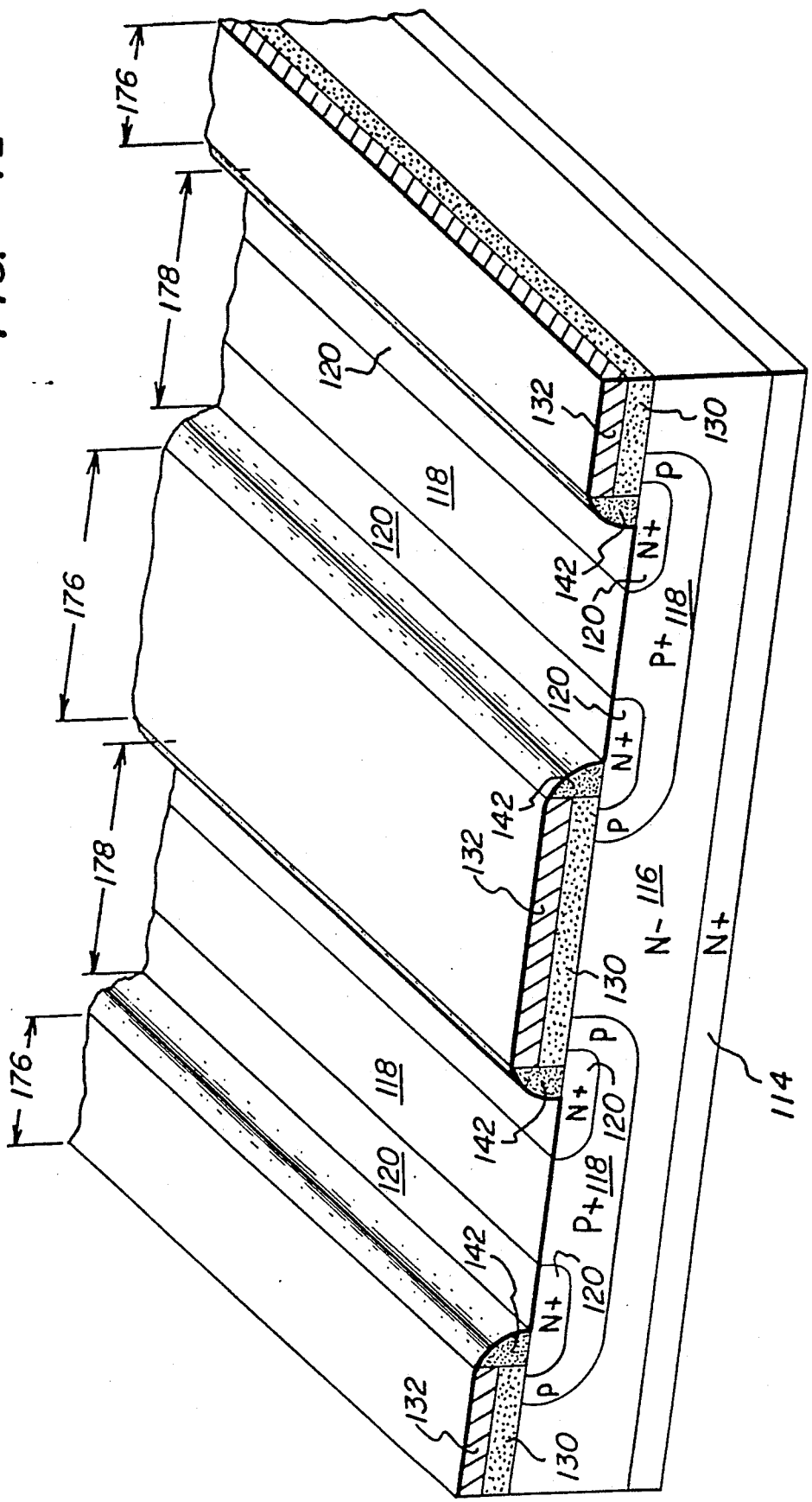

Thereafter, the high temperature oxide (HTO) is anisotropically etched by reactive ion etching (RIE) the wafer in a gas mixture consisting of trifluoromethane ($CHF_3$) and argon (Ar). This anisotropic etch works primarily in the vertical direction with the result that when the upper surface of the polycrystalline silicon and the upper surface of the semiconductor body have just been cleared of HTO, there is a segment of the HTO left adjacent to each vertical wall of the polycrystalline silicon 132 at the edges of the windows 170 as shown in FIG. 4I. These oxide segments whose width is virtually the same as the original thickness of the deposited oxide, stand essentially as high as the top of the polycrystalline silicon and are referred to as oxide spacers. Consequently, the vertical etching of the HTO is stopped as soon as the surface of the polycrystalline silicon and the surface of the semiconductor body have been exposed. As a result, two separate windows are created, i.e. a third window 176 consisting of the upper surface of the polycrystalline silicon 132 and a fourth window 178 consisting of the exposed upper surface of the body region 118 and the source region 120 as shown in FIG. 4I.

Figure 4J:
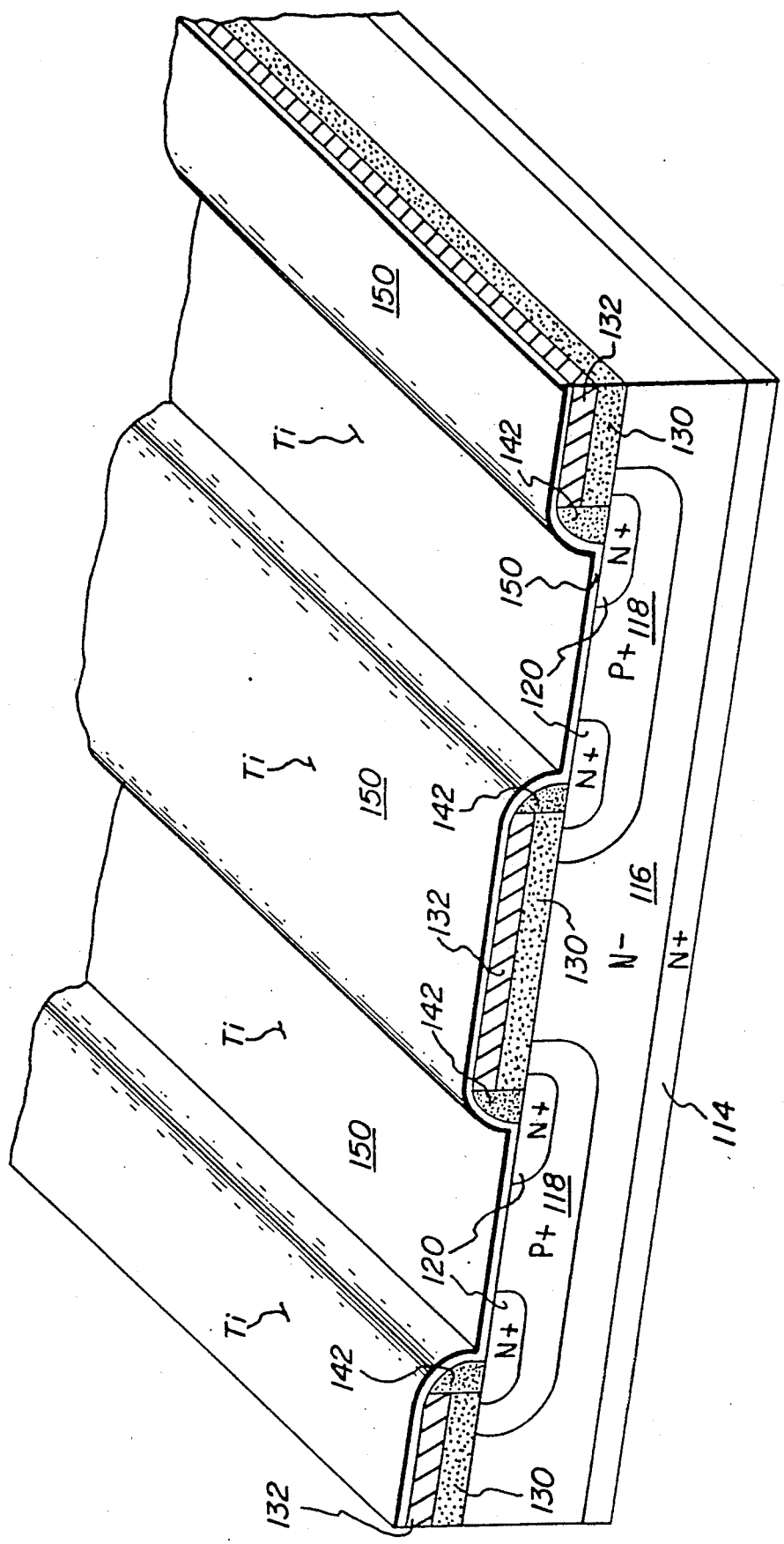
Figure 4L:
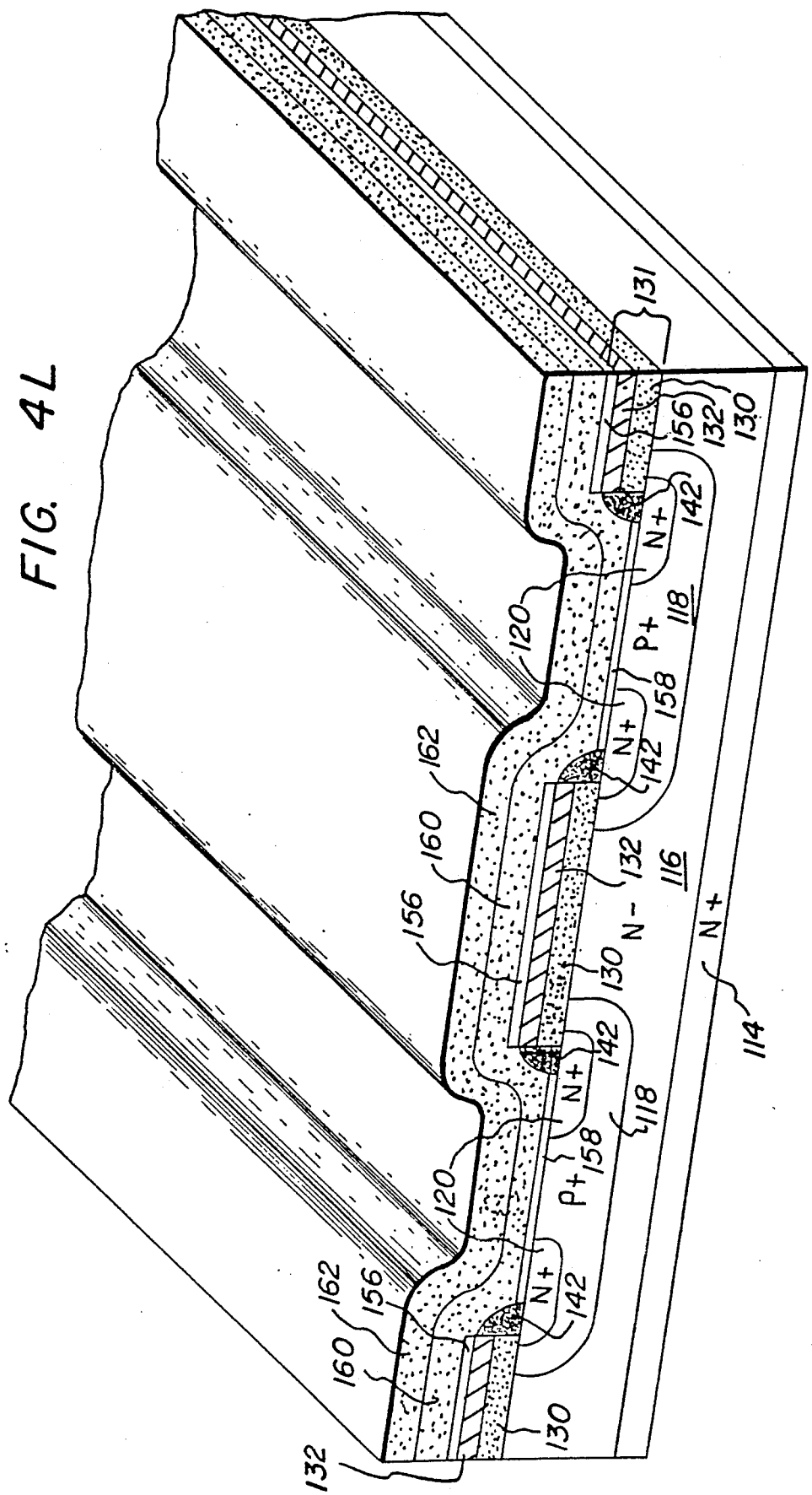

Next, a 1,000 angstrom thick layer of titanium (Ti) is sputtered onto the upper surface of the wafer (FIG. 4J). Thereafter, under carefully controlled conditions, the titanium is reacted with the silicon of the polycrystalline silicon or the semiconductor body in accordance with its location to create titanium silicide. Two different methods of doing this are known at this time, but any other method may be utilized. The first method employs a furnace. The wafer is placed in a furnace which is set to 600° C. for a period of 40 minutes in a forming gas (80% $N_2$ and 20% $H_2$) or in pure $N_2$. At the end of this period, a metastable form of $TiSi_x$ has formed on the silicon surfaces with very little reaction with the oxide of the spacer. The wafer is then wet etched in a mixture of concentrated sulfuric acid and $H_2O_2$ in a 50:50 mixture for about 10 minutes. This removes the unreacted titanium from the wafer. This removal is primarily from the oxide spacer. This etch also removes any titanium nitride (TiN) which may have been formed. Thereafter, the wafer is reacted a second time in a furnace at a temperature in the range from 800°-850° C. for a period of 40 minutes in forming gas. At the end of this step, the titanium silicide is in a highly stable form ($TiSi_2$). As an alternative, the silicide reaction can be induced using rapid thermal anneal (RTA) in which a high flux halogen lamp is used to heat the surface of the semiconductor body to a much higher temperature. The wafer is exposed to this lamp for approximately 20 seconds in a nitrogen ambient to produce an average temperature of 600° C. Thereafter, the wafer is etched in the concentrated sulfuric acid/$H_2O_2$ etchant in the same manner as has just been described with respect to the furnace process. Thereafter, the wafer is exposed to a higher flux from the halogen lamp to heat it to an average temperature of 800°-850° C. for 20 seconds. At the end of this process, a stable titanium silicide is provided. In this rapid thermal anneal process, the actual temperature of the surface of the wafer cannot be easily determined because it is a transient temperature and the 600° and 800° average temperatures are measured in the presently accepted manner in the art. It is recognized, that these temperatures probably do not accurately reflect the actual temperature at the surface of the wafer on which the flux from the halogen lamp impinges.

At the end of this time, a 2,000 angstrom thick layer 156 of titanium silicide ($TiSi_2$) is disposed on the polycrystalline silicon of the gate electrode and a 2,000 angstrom thick layer 158 of titanium silicide ($TiSi_2$) is disposed over the body and source regions within the window 178 as shown in FIG. 4K.

Thereafter, a 4,000 angstrom thick layer 160 of low temperature oxide (LTO) is deposited over the wafer at a temperature of about 450° C. by low temperature CVD. This layer is preferably conformal, but need not be. The source gases may preferably be silane and oxygen as is known in the art. This low temperature oxide layer includes many pinholes. It is therefore densified at a temperature in the 800°-900° C. range in a nitrogen atmosphere for a period of from 30 to 60 minutes. This densification temperature is preferably kept low enough that there is not much titanium diffusion from the titanium silicide into the silicon of the gate electrode or wafer. After the completion of this densification, a second 4,000 angstrom thick layer 162 (FIG. 4L) of LTO is deposited on the wafer and densified in a similar manner in order to provide an 8,000 angstrom thick layer 164 (FIG. 4M) of dense, pinhole-free oxide. In our work, we have found that a single 8,000 angstrom thick layer of LTO does not densify as well as the two 4,000 angstroms thick layers with the result that the two layers are preferred. This is particularly true, since pinholes in the two separate layers are not likely to be aligned with each other.

Next, the upper surface of the wafer is coated with a layer of photoresist which is patterned to provide a contact hole over the layer 158 of titanium silicide disposed on the source and body regions. The wafer is then reactive ion etched in a gas mixture of $CHF_3$ and argon in order to provide a selective preference for etching $SiO_2$ as compared to $TiSi_2$. This process normally results in a loss of about 400 angstroms of titanium silicide at the bottom of the contact window 180. This leaves a titanium silicide layer of 1,600 angstroms, which is sufficient for proper device operation. The device at the end of this etching is shown in FIG. 4M.

Wet hydrogen fluoride etching is not used to open the contact window because hydrogen fluoride etches titanium silicide even faster than it etches $SiO_2$ and it is desired to maintain as much of the titanium silicide at the bottom of the window 180 as possible. Immediately upon removing the wafer from the reactive ion etching chamber, a layer of titanium oxide (TiO) forms over the exposed titanium silicide due to a a reaction with the oxygen in the air. In order to provide a low resistance ohmic contact between the titanium silicide and the subsequently deposited metallization, the wafer is placed in a sputtering chamber and is sputter etched using argon ion bombardment for a period of about 10 minutes to remove 300-400 angstroms uniformly across the wafer surface. This removes all of the titanium oxide in the contact window 180. Thereafter, without breaking the vacuum in the sputtering chamber, a 1,000 angstrom layer of a barrier metal such as TiW is sputtered onto the wafer. This material serves several purposes. First, it prevents aluminum spiking which can otherwise result from the subsequent deposition or sintering of an aluminum metallization layer over the wafer. Second, it minimizes contact electromigration of the aluminum metallization. An aluminum metallization layer is then sputtered onto the wafer surface, preferably in the same sputtering chamber, but in a different sputtering chamber, if desired. An aluminum thickness of about 3 microns is preferred. The aluminum may be pure aluminum or an aluminum silicon alloy as is well known in the art. At the end of the aluminum sputtering step, the wafer appears as shown in FIG. 3.

The drain metallization 136 shown in FIG. 3 may be applied in the same manner and at the same time as the source metallization or separately as may be desired. Metallization contact to the gate electrode is provided in the usual manner at the periphery of the device active area and is not shown in the figures. At the completion of the device fabrication process, the wafer is diced into individual devices if multiple devices have been fabricated. Naturally, if a whole wafer device has been fabricated or the fabricated devices are to be used in their wafer form, the wafer is not diced.

It will be understood, that other dielectrics and etchants than those described may be utilized provided they provide the desired effects at each stage in the process and during device operation.

It will be noted, that the body region 118 and the source region 120 are both self-aligned with respect to the edge of the aperture 170 in the electrode. The titanium silicide layer 158 is self-aligned with respect to the edges of the spacers 142 at the edge of the window 178. Since the spacers are of substantially uniform thickness, the titanium silicide layer 158 is thereby self-aligned with respect to the aperture 170 in the gate electrode. However, it will be recognized that even though the titanium silicide layer 158 is self-aligned with the aperture in the gate electrode, it is spaced from the edges of the gate electrode by the thickness of the spacers 142.

The contact window 180 need not be centered within the window 178 so long as it does not encroach so close to the edge of the spacer as to adversely effect the device operating characteristics. Left and right limits on the position of the contact window 180 are illustrated in FIG. 4M. It will be recognized, that the location of the limits for the window 180 depend on the thickness of the spacer and other characteristics of the device structure.

While the embodiment which has been described relies on selective reaction of titanium (Ti) with silicon, cobalt is an alternative metal which may be used in this process. As a further alternative, selective deposition of tungsten (W) or molybdenum (Mo) may be used instead of the selective reaction. Selective deposition of a silicide forming metal obviates the need for the two stage silicidation process with the intervening etch, since no silicide forming metal is disposed on the spacer. As a further alternative, a selectively depositable metal which does not form a silicide may be used if it is compatible with the subsequent processing steps.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A multicellular, field effect, power semiconductor device comprising:
   a body of semiconductor material having opposed first and second major surfaces and a first region of one type conductivity extending to said first major surface;
   an insulated gate electrode disposed on said first major surface, said insulated gate electrode having a plurality of apertures therein;
   a plurality of cells, each associated with one of said apertures in said gate electrode, each of said cells including:
      a second region of opposite type conductivity extending into said first region from said first major surface beneath the gate-electrode aperture for that cell,
      a third region of said one type conductivity disposed in said second region and extending to said first major surface,
      said second and third regions being self-aligned with respect to the gate-electrode aperture for that cell,
      said second region including a channel portion disposed between said first and third regions, beneath said insulated gate electrode and self-aligned with respect to the gate-electrode aperture for that cell, and
      said second and third regions having a high conductivity layer selected from the group consisting of metals and metal-silicides disposed thereon in ohmic contact therewith, said high conductivity layer being self-aligned with respect to said aperture in said gate electrode and spaced from said gate electrode;
   a layer of dielectric material disposed over said body of semiconductor material and having a plurality of contact apertures therein, each of said contact apertures being situated over said high conductivity layer of a different cell, each of said contact apertures being substantially smaller in lateral extent than said high conductivity layer over which it is disposed; and
   a layer of metallization disposed over said dielectric layer, extending into each of said contact apertures and into ohmic contact with each of said high conductivity layers.

2. The multi-cellular, field effect, power semiconductor device recited in claim 1 wherein, in each cell: said second region extends to said first surface within an aperture in said third region and said high conductivity layer is also disposed in ohmic contact with said second region.

3. The multi-cellular, field effect, power semiconductor device recited in claim 2 wherein:
   the lateral dimensions of said contact aperture are the same as or smaller than the lateral dimensions of the surface intercept of said second region with said high conductivity layer.

4. The multi-cellular, field effect, power semiconductor device recited in claim 1 wherein:
   said insulated gate electrode comprises a layer of silicon; and
   said device further includes a second high conductivity layer selected from the group consisting of metals and metal-silicides disposed on said silicon layer of said insulated gate electrode.

5. The multi-cellular, field effect, power semiconductor device recited in claim 1 wherein:
   said device further includes a second layer of metallization disposed on said second major surface in ohmic contact with said semiconductor material.

6. The multi-cellular, field effect, power semiconductor device recited in claim 5 wherein:
   said second layer of metallization is disposed in ohmic contact with material of said one type conductivity.

7. The multi-cellular, field effect, power semiconductor device recited in claim 5 wherein:
   said second layer of metallization is disposed in ohmic contact with material of said opposite type conductivity.

8. The multi-cellular, field effect, power semiconductor device recited in claim 1 wherein:
   in each cell, said second region extends to said first surface beneath said gate-electrode aperture in a manner which locally spaces apart two portions of said third region beneath said gate aperture; and
   in at least one of said cells, said contact aperture is spaced from one of said portions of said third region.

9. The multi-cellular, field effect, power semiconductor device recited in claim 1 wherein said high conductivity layer comprises a metal silicide.

10. The multi-cellular, field effect, power semiconductor device recited in claim 9 wherein:
    said metal silicide is selected from the group consisting of titanium silicide and cobalt silicide.

11. The multi-cellular, field effect power semiconductor device recited in claim 10 wherein:
    said metal silicide is titanium silicide.

12. The multi-cellular, field effect, power semiconductor device recited in claim 4 wherein the first recited and said second high conductivity layers both comprise metal silicides.

13. The multi-cellular, field effect, power semiconductor device recited in claim 12 wherein:
    said metal silicide is selected from the group consisting of titanium silicide and cobalt silicide.

14. The multi-cellular, field effect power semiconductor device recited in claim 12 wherein:
    said metal silicide is titanium silicide.

* * * * *